US007773220B2

(12) United States Patent
Feger et al.

(10) Patent No.: US 7,773,220 B2
(45) Date of Patent: Aug. 10, 2010

(54) METHOD AND SYSTEM FOR COLLECTING ALIGNMENT DATA FROM COATED CHIPS OR WAFERS

(75) Inventors: Claudius Feger, Poughkeepsie, NY (US); Nancy C. LaBianca, Yalesville, CT (US); Steven E. Steen, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 12/061,196

(22) Filed: Apr. 2, 2008

(65) Prior Publication Data
US 2009/0251698 A1    Oct. 8, 2009

(51) Int. Cl.
*G01B 11/00* (2006.01)
(52) U.S. Cl. ...................................... 356/401
(58) Field of Classification Search ......... 356/399–401, 356/237.2–237.5
See application file for complete search history.

(56) References Cited

U.S. PATENT DOCUMENTS

| 5,966,215 | A * | 10/1999 | Markoya et al. ............. 356/400 |
| 6,064,217 | A * | 5/2000 | Smith .......................... 324/760 |
| 6,410,415 | B1 * | 6/2002 | Estes et al. .................. 438/612 |
| 6,544,698 | B1 | 4/2003 | Fries |
| 6,590,657 | B1 * | 7/2003 | Summerer et al. .......... 356/401 |
| 6,765,666 | B1 | 7/2004 | Guest |
| 6,774,493 | B2 * | 8/2004 | Capote et al. ............... 257/778 |
| 6,919,420 | B2 | 7/2005 | Buchwalter |
| 6,924,171 | B2 | 8/2005 | Buchwalter |
| 6,961,994 | B2 | 11/2005 | Terada |
| 7,030,772 | B1 * | 4/2006 | Lee et al. .................. 340/686.1 |
| 7,271,482 | B2 | 9/2007 | Kirby |
| 2008/0265445 | A1 * | 10/2008 | Feger et al. .................. 257/797 |

FOREIGN PATENT DOCUMENTS

| EP | 00959654 | 11/1999 |
| JP | 2001-012914 | 4/1998 |
| JP | 11-312703 | 5/1999 |

* cited by examiner

*Primary Examiner*—Gregory J Toatley, Jr.
*Assistant Examiner*—Isiaka O Akanbi
(74) *Attorney, Agent, or Firm*—Graham S. Jones, II; Louis J. Percello; Robert M. Trepp

(57) ABSTRACT

A process and system for determining alignment data for partially obscured features on wafers or chips when a wafer or chip is substantially coated by an over bump applied material, e.g. a resin or film, and using that data to align the wafers or chips for subsequent operations such as dicing or joining. Position data for alignment is produced by identifying a location of an at least partially obscured feature by varying the depth of focus upon a work piece to determine an SNR approximating a maximum value from an image captured by optical scanning. An SNR above a threshold value can be employed.

20 Claims, 8 Drawing Sheets

0°

45°

90°

135°

180°

225°

270°

315°

0°

METHOD AND SYSTEM FOR COLLECTING ALIGNMENT DATA FROM COATED CHIPS OR WAFERS

FIELD OF THE INVENTION

This invention relates to a method of identifying and determining the alignment of features on wafers or chips that are coated by a layer of transparent or partially opaque material known as over-bump applied underfill.

BACKGROUND OF THE INVENTION

Flip chip technology is the fastest growing chip interconnect technology as it allows very large numbers of I/Os. Thus, the footprint of chips with low numbers of I/O's can be made very small. This is also true for associated packages such as chip-scale packages.

FIGS. 1A-1C show a prior art device 10 comprising a fragment of a semiconductor chip 11 on which C4 solder balls 12 are supported on pads 13 on the chip 11 (which may be composed of silicon). There is underfill 14 formed on the surface of the chip 11 and between the C4 solder balls 12. In FIG. 1A, the underfill 14 does not cover the C4 solder balls 12 but leaves the top surfaces thereof exposed. In FIG. 1B, the underfill completely covers the C4 solder balls 12 leaving the top surfaces thereof unexposed. In FIG. 1C, the underfill 14 does not cover the C4 solder balls 12 and leaves the top surfaces and portions of the upper surfaces thereof exposed.

FIGS. 2A-2C show a prior art device 10 comprising a fragment of a semiconductor chip 11 on which cylindrical bumps 16 with flat tops are supported on pads 13 on the chip 11. There is underfill 14 formed on the surface of the chip 11 and between the cylindrical bumps 16. In FIG. 2A, the underfill 14 does not cover the cylindrical bumps 16 but leaves the top surfaces thereof exposed. In FIG. 2B, the underfill completely covers the cylindrical bumps 16 leaving the top surfaces thereof unexposed. In FIG. 2C, the underfill 14 leave upper portions of the cylindrical bumps 16 exposed and leaves the top surfaces and portions of the sidewall surfaces thereof exposed.

The major advantage of flip chip technology is that it can utilize the total chip area to make the I/O connections, while wire bonding uses only the chip periphery. Referring to FIGS. 1A-1C and 2A-2C, a disadvantage of flip chip technology is that stresses that arise from the thermal mismatch between the chip 11 Coefficient of Thermal Expansion (CTE) and the CTE of the substrate are borne fully by the solder bumps (solder ball bumps 12 and cylindrical bumps 16), e.g. Controlled Collapse Chip Connections (C4s), used to make the interconnect between a chip and substrate 11. In order to ameliorate the stresses in flip chip packages the region between the chip and the substrate is filled with an underfill material which encapsulates the solder bumps or C4 connections. The underfill material may be an Over-Bump Applied Resin (OBAR). The over bump applied resin underfill material is placed between the chip and the substrate and acts as encapsulant of the solder bumps and as an adhesive between chip and substrate. The effect of such underfills is that the long-time reliability of underfilled flip chip packages is greatly enhanced compared to non-underfilled counterparts.

Such resin underfill material 14 can be applied by capillary flow, using a so-called no-flow process or by wafer-level applied processes. There are several wafer-level applied underfill processes, among them a Wafer-Level Underfill (WLUF) process which uses an over bump applied resin, that is then b-staged, followed by dicing the wafer to singulate chips and finally joining the chips with the WLUF layer to substrates. U.S. Pat. No. 6,919,420 Buchwalter et al which is incorporated herein by reference describes the WLUF process employed in connection with this invention.

U.S. Pat. No. 6,924,171 of Buchwalter et al., which is incorporated herein by reference, illustrates a method of flip chip joining of chips to substrates in accordance with the method of this invention.

There is the problem that an over bump applied resin layer can obscure the pattern of the electrical connect structure (C4s, copper studs, micro-bumps and similar structures) and other alignment marks making it difficult to align a wafer for dicing, a wafer for wafer to wafer joining, or a singulated chip for joining to its respective substrate or to another chip in 3-D applications. A singulated chip is a single chip produced by dicing.

To align wafer or chip, the over bump applied resin is a material which must be either transparent or translucent and the thickness of the layer must be thin enough so that the pattern is still visible. While it may be advantageous to use a thicker over bump applied resin coating, the thicker the underfill layer, the less visible are the connect structures or other alignment marks. Thus, alignment of wafer or chip under such conditions is a significant problem.

FIGS. 3A-7A show a set of prior art plan views of exemplary prior art features on fragments of chips 11 with different patterns which are to be identified and for which the alignment needs to be determined. FIGS. 3B-7B show cross-sectional views of the features shown in FIGS. 3A-7A.

FIGS. 3A and 3B show a fragment of a chip 11 supporting a conductive metallic pad 13 on which a bump 20 has been formed. The bump 20 has an elliptical shape in both the plan and the cross-sectional views.

FIGS. 4A and 4B show a fragment of a chip 11 supporting an alignment mark 22 which has an cross shape in the plan view and a rectangular shape in the cross-sectional view.

FIGS. 5A and 5B show a fragment of a chip 11 supporting a conductive metallic pad 13 on which a bump 24 has been formed. The bump 24 has a circular pattern in the plan view and a semi-spherical shape in the cross-sectional view.

FIGS. 6A and 6B show a mark 26 which has a hollow, annular shape in plan view and in the cross-sectional view.

FIGS. 7A and 7B show a fragment of a chip 11 supporting a conductive metallic pad 13 on which a bump 28 has been formed. The bump 28 is solid and has a round shape in plan view and a rectangular shape in the cross-sectional view.

While it is often possible to align wafers and chips in which the connect structures are visible to the naked or aided eye by manual alignment, this process is undesirable in a manufacturing environment in which parts must be aligned quickly with high accuracy by an automated process.

Accordingly, a need exists for a process to recognize the exact or approximate location of one or more of the connect structures or other alignment marks which are at least partially obscured by an over-bump applied material such as used in the WLUF process. These and other needs are met by the recognition method of the invention described in the following. Other advantages of the present invention will become apparent from the following description and appended claims.

Heretofore, in the case of the surface of an over bump applied resin or over bump applied material in an application with features such as coated C4 balls the optical system has not been able to automatically recognize the diffuse location of the partially obscured features (C4 balls) and has been unable to identify the location thereof exactly or approximately.

SUMMARY OF THE INVENTION

In accordance with an aspect of this invention, a method is provided for determining feature position data to be used for alignment by employing identification of a location of a feature that is at least partially obscured by varying the depth of focus upon a feature on a work piece thereby enabling obtaining and determining a Signal to Noise Ratio (SNR) approximating a maximum value from an image captured by optical means scanning of a feature on said work piece. Preferably, the feature comprises an electrical interconnect structure such as a C4 solder ball or a copper stud bump; the feature is obscured by an over bump applied material. Preferably, employ a focus depth offset from a surface to obtain good images. Preferably, employ the results of a first alignment using a focus offset metric that can be used in subsequent alignment determination steps on either the same or subsequent samples in a same or a subsequent batch. Preferably, employ pattern recognition of a feature in best focus to determine location information as to an exact or approximate location of said feature; and subsequently use the location information for the alignment of the sample to another matched or designated pattern.

In accordance with another aspect of this invention, a method of alignment comprises determining feature position data to be used for alignment by employing identification of an approximate location of a feature that is at least partially obscured by a partially opaque material by varying focus upon a feature on a work piece; obtaining and determining a maximum Signal to Noise Ratio (SNR) from an image captured by optical means scanning of a feature on said work piece; whereby high contrast imaging of feature edges are obtained. Preferably, employ pattern recognition of a feature in best focus to determine location information as to an approximate location of said feature, and subsequently use the location information for alignment of the sample to another matched or designated pattern.

Preferably the above methods are used in combination with a mathematical determination of the location of the patterns without requiring prior learning of patterns in best focus to determine the approximate location of said features, and subsequently using this information for the alignment of the sample to another matched or designated pattern.

Preferably the above methods are used for the alignment of matching parts in such applications as wafer alignment for wafer to wafer bonding, or chip alignment for chip to wafer bonding or chip to chip bonding or chip to substrate bonding. Preferably apply the above methods to pick and place tools and/or for the purpose of wafer alignment for dicing.

In accordance with still another aspect of this invention, apparatus is provided including a computer system and software for providing alignment data to be used for alignment by employing identification of an approximate location of a feature that is at least partially obscured by varying focus upon a feature on a work piece thereby enabling obtaining and determining a Signal to Noise Ratio (SNR) approximating a maximum value from an image captured by optical means scanning of a feature on said work piece.

BRIEF DESCRIPTION OF THE DRAWINGS

FIGS. 3A-7A are plan views of features formed on top of a semiconductor chip.

FIGS. 3B-7B are respective sectional elevational views of the features of FIGS. 3A-7A.

DETAILED DESCRIPTION OF THE INVENTION

The invention is a process for recognizing the exact or approximate location of one or more partially obscured features or electrical connect structures such as exemplified by features such as C4 solder balls on a chip alternatively on a wafer which are at least partially coated with an over bump applied resin or material. The invention is based on a focusing routine thereby enabling an operator or a tool to obtain and determine a maximum or near maximum Signal to Noise Ratio (SNR) from an image captured by optical means. This high SNR image in turn enables fully automated alignment through either edge detection or image recognition methods. Alternatively, a SNR which is above a threshold value can be employed.

In accordance with this invention a sample that is coated with an over bump applied resin is loaded into an apparatus that is equipped with a tool including a sample holder, a substrate holder and an optical recognition system capable of aligning a sample to a substrate. Subsequently, the optical system focuses on the surface of the sample using traditional techniques. Next, the tool scans down through the focus until the maximum or near maximum SNR is achieved on the image capture. The maximum or near maximum SNR is achieved when the focus reaches the level of the plane where the feature sidewalls, e.g. sidewalls of solder balls, are vertical. The limited depth of focus of the optical system images a "cross section" which in the case of C4 balls is a circle. The exact or approximate location of the feature (e.g. a bump or a C4 solder ball) is now identified by determining the center point of the feature (e.g. a circle) and comparing the center point location to the location where the center point must be located for perfect alignment. Data which represents the focus offset to the surface that most accurately identifies the location of the partially obscured structure is identified and stored. That focus offset data can then be applied directly to other samples to maximize throughput since the through-focusing step requires some time.

Using the sidewall focus level the location of the features (e.g. features of a bump or a C4 solder ball), independent of the quality and thickness of the over bump applied resin layer, can be determined with a very high degree of accuracy.

Figure 9A:
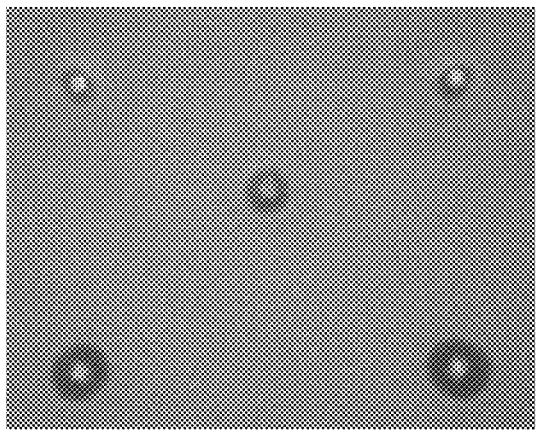
FIGS. 9A-9R are a series of photomicrographs of solder balls formed on a chip which are covered by an over-bump applied resin. Each of the photomicrographs shows the same feature at incremental focus settings of the optical system in a manner where the level of focus moves in a linear fashion in the z-axis from FIG. 9A to FIG. 9R. For each of these focus settings the image is analyzed for maximum Signal-to-Noise Ratio (SNR) on the edge of the features. If maximum SNR has been determined, the optimal focus setting can be determined. In this example the maximum SNR can be seen to be obtained in FIG. 9P where the edge of the feature is most clearly defined. If the focus setting continues to be increase from the setting in FIG. 9P, it can be seen the SNR decreases again from FIG. 9P to FIG. 9R.
Figure 9B:
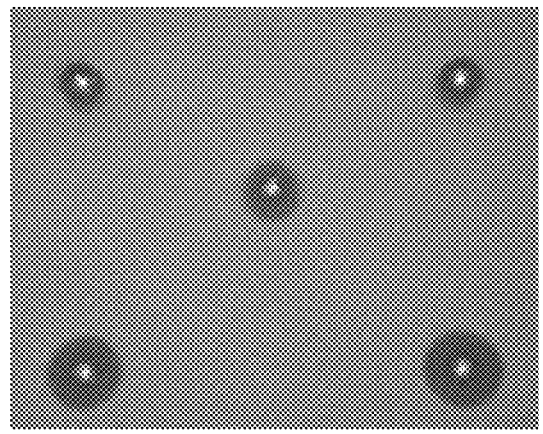
Figure 9C:
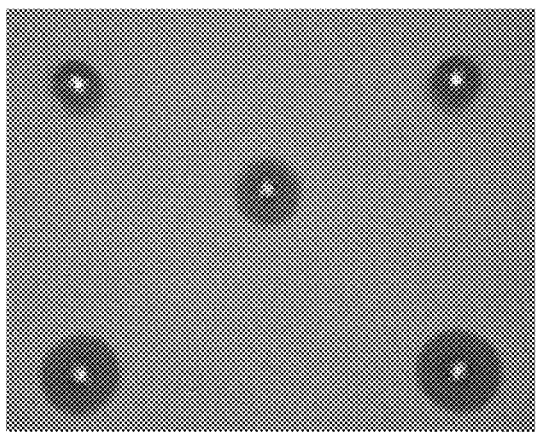
Figure 9D:
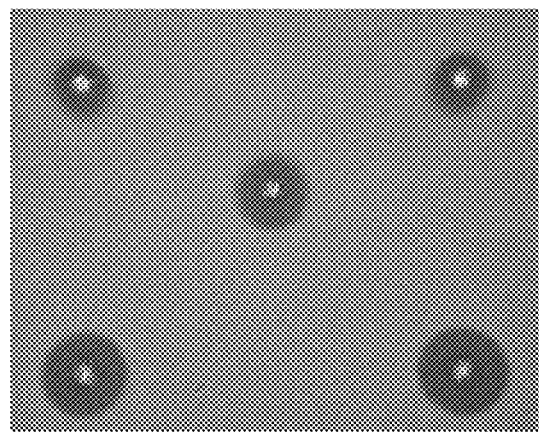
Figure 9E:
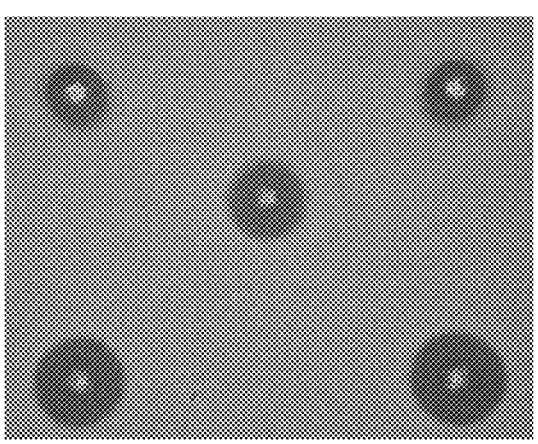
Figure 9F:
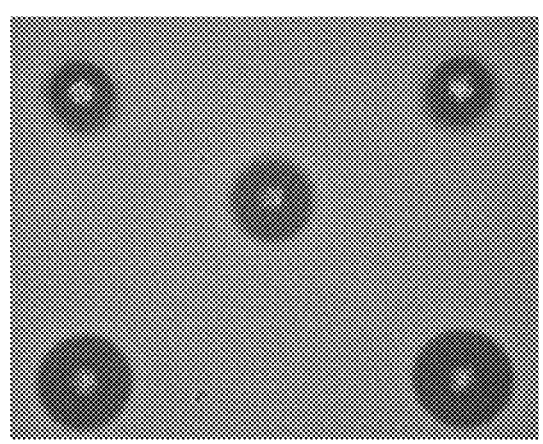
Figure 9G:
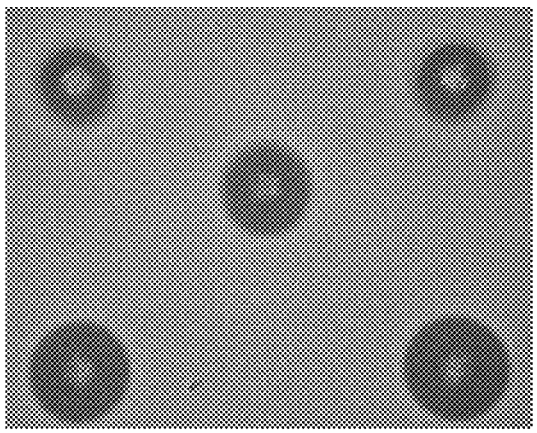
Figure 9H:
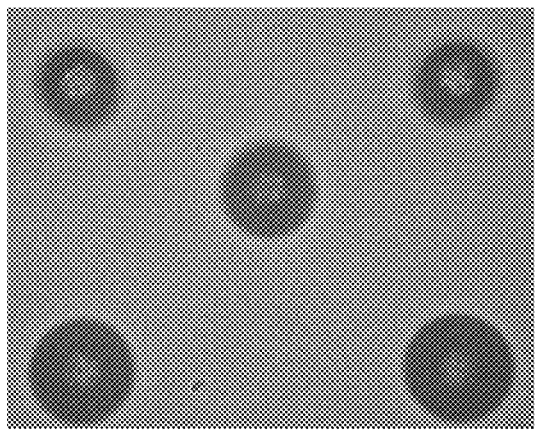
Figure 9I:
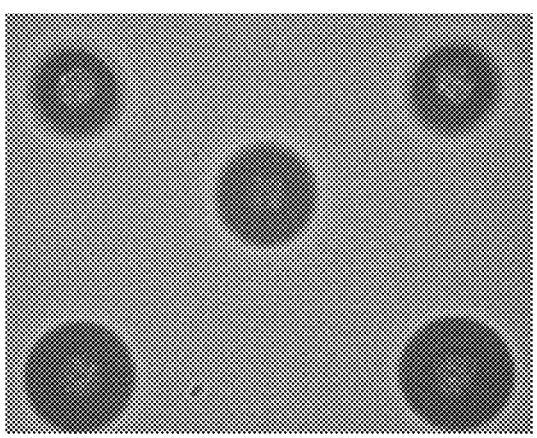
Figure 9J:
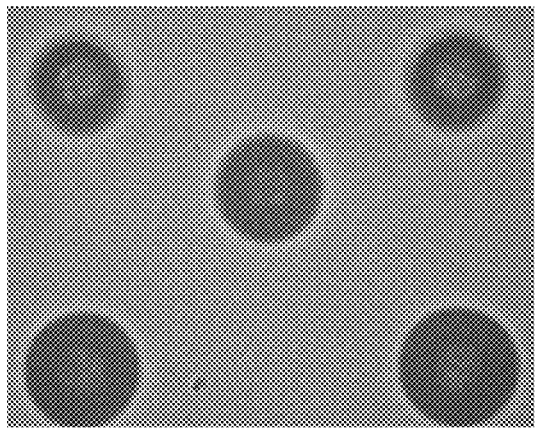
Figure 9K:
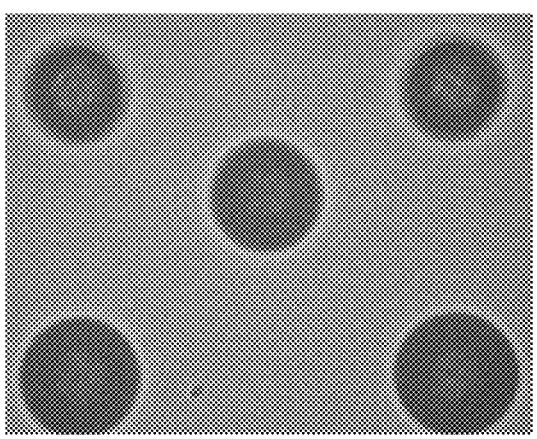
Figure 9L:
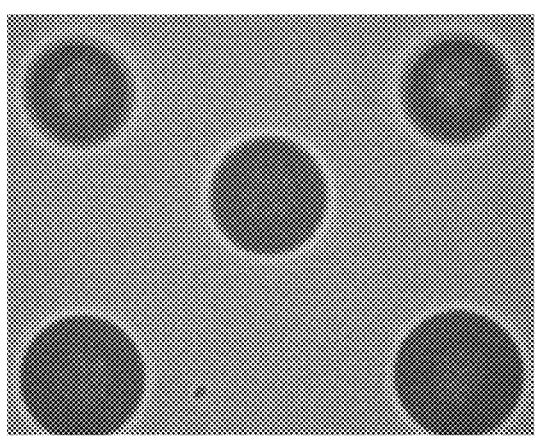
Figure 9M:
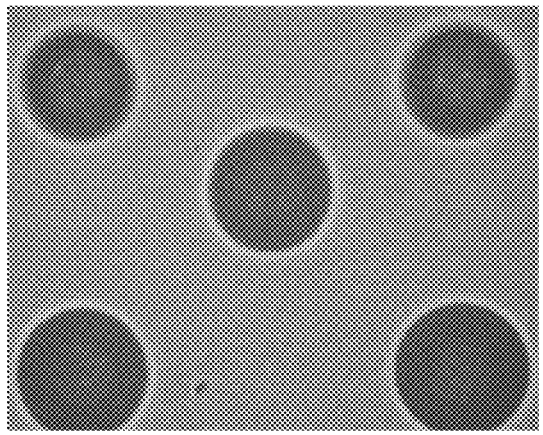
Figure 9N:
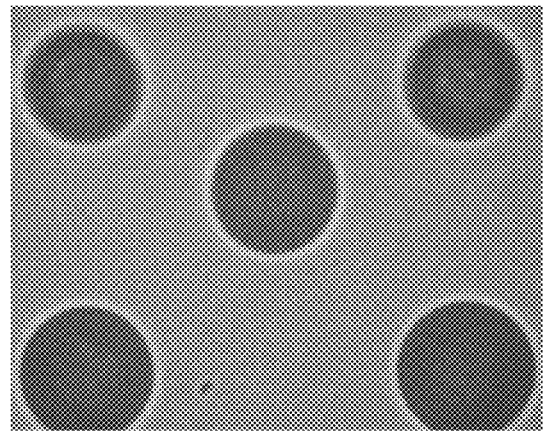
Figure 9O:
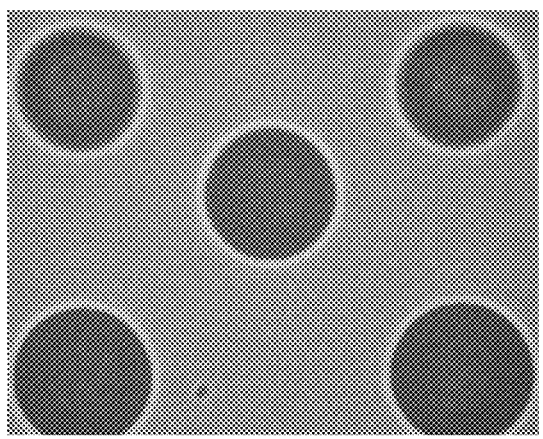
Figure 9P:
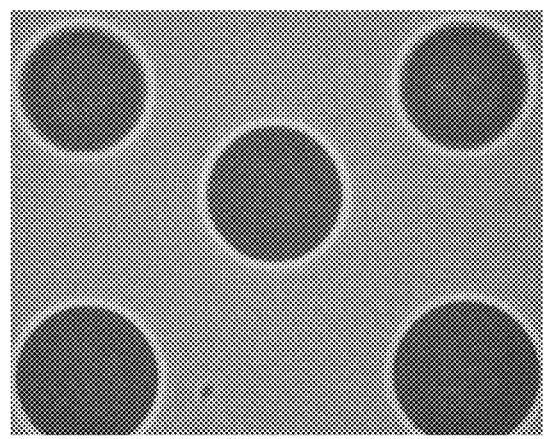
Figure 9Q:
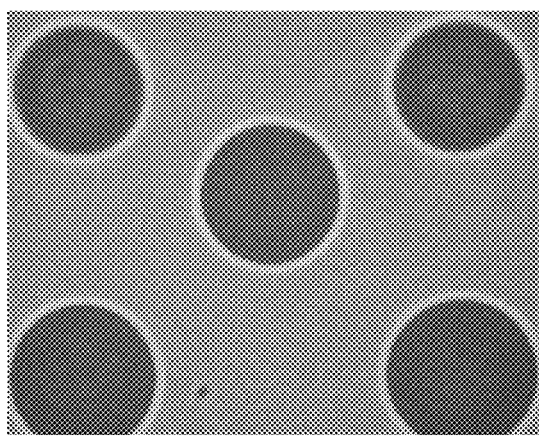
Figure 9R:
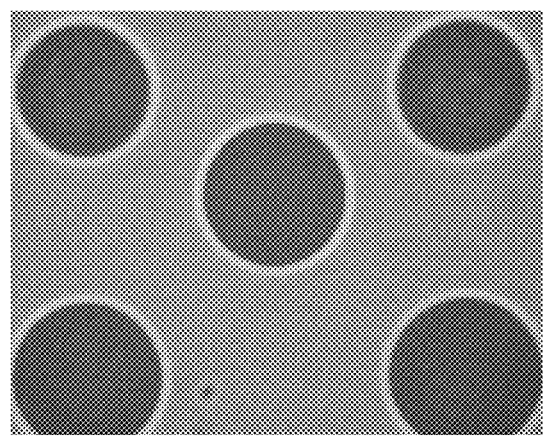
Figure 10A:
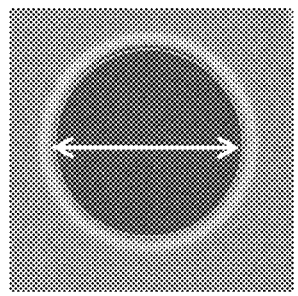
FIGS. 10A-10I are images of the scanning of a round feature in accordance with this invention to determine the radius of the round feature.
Figure 10B:
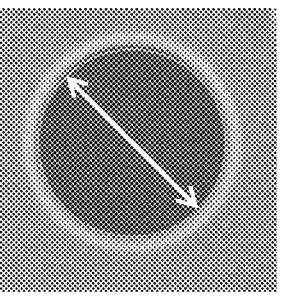
Figure 10C:
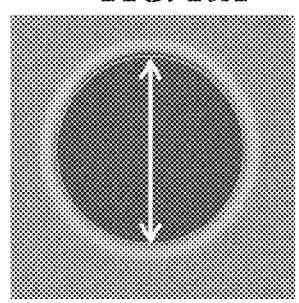
Figure 10D:
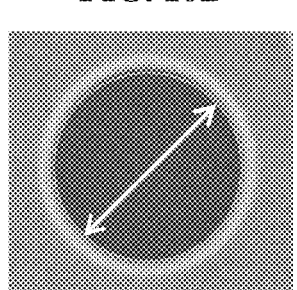
Figure 10E:
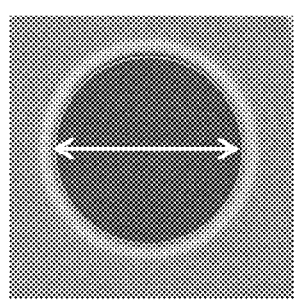
Figure 10F:
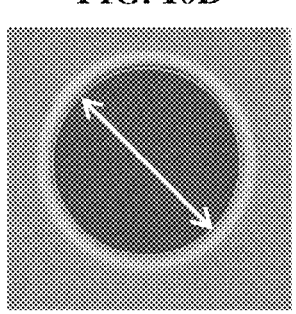
Figure 10G:
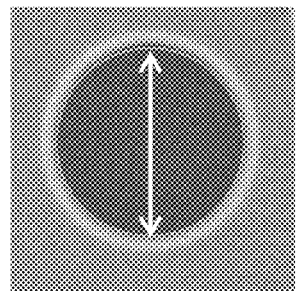
Figure 10H:
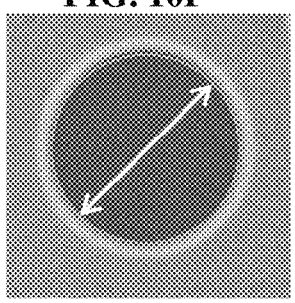
Figure 10I:
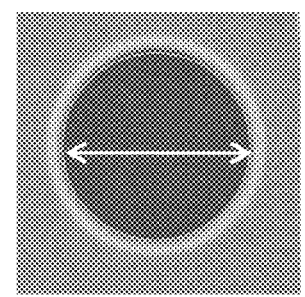

FIGS. 9A-9R are a series of photomicrographs of solder balls formed on a chip which are covered by over bump applied resin. Each of the photomicrographs shows the same feature at incremental focus settings of the optical system in a manner where the level of focus moves in a linear fashion in the z-axis from FIG. 9A to FIG. 9R. For each of these focus settings the image is analyzed for maximum SNR on the edge of the features. If maximum SNR has been determined, the optimal focus setting can be determined. In this example the maximum SNR can be seen to be obtained in FIG. 9P where the edge of the feature is most clearly defined. If the focus setting continues to be increase from the setting in FIG. 9P, it can be seen the SNR decreases again from FIG. 9P to FIG. 9R.

An example of a method for determining alignment includes image based pattern recognition which uses learning from a first run and comparison of the images of subsequent runs to determine the center point.

Referring to FIGS. 10A to 10I, a second method for determining alignment uses the geometric properties of the structures and models a circle to the image which can be done without teaching the tool in advance what the image looks like. The center of the modeled circle indicates the exact or approximate location of the structure.

Once the location of one feature (e.g. a bump or a solder ball) is determined, at least one other feature must be sampled (within the image field or through multiple image fields) to calculate a model of the sample alignment (X, Y, Theta with 2 points, higher order alignment parameters with increasing numbers of alignment locations).

The preferred embodiment of this invention is the use of the focus scan to determine the highest SNR on the image capture and therefore the best positional performance of the alignment system. The focus offset to the surface would be stored in memory and subsequent alignment sites would be imaged using this focus offset, maximizing throughput. This embodiment maximizes the performance through process variations.

In another aspect of the method of this invention use is made of the focus scan to maximize SNR in the image capture on all sites. This is the most accurate embodiment of this invention but comes with a throughput penalty which may preclude the use of this embodiment in high-volume applications.

Still another aspect of this invention adds a focus offset from an automated focus that results in a best-guess focus on the sidewalls of the connect structures. This method is sensitive to connect structure variations such as solder ball size and shape and is not as precise as the first two embodiments; this embodiment has the greatest throughput.

This invention does not require the invention of a new optical alignment or new focusing system. Instead it works with many of the currently available optical alignment systems.

Figure 1A:
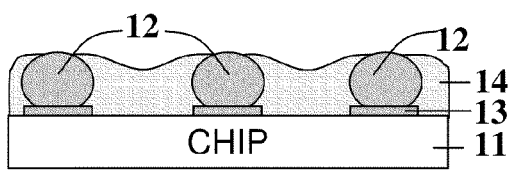
FIGS. 1A-1C depict sectional views of prior-art Wafer Level UnderFill (WLUF) structures with solder balls.
Figure 2A:
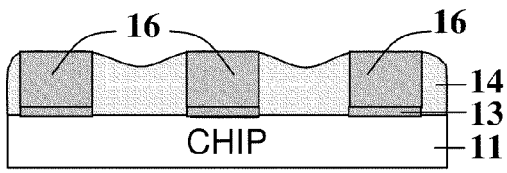
FIGS. 2A-2C depict sectional views of prior-art Wafer Level UnderFill (WLUF) structures with solder bumps.
Figure 1B:
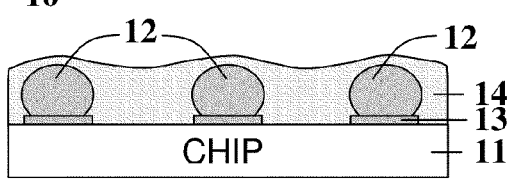
Figure 2B:
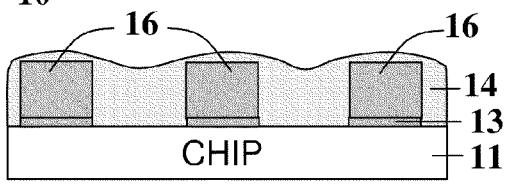
Figure 1C:
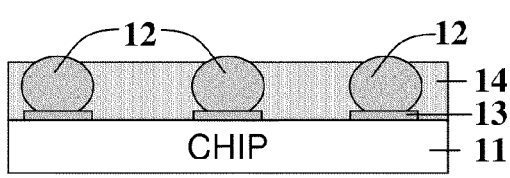
Figure 2C:
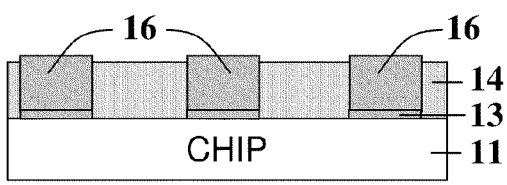
Figures 3A, 4A, 5A, 6A, 7A:
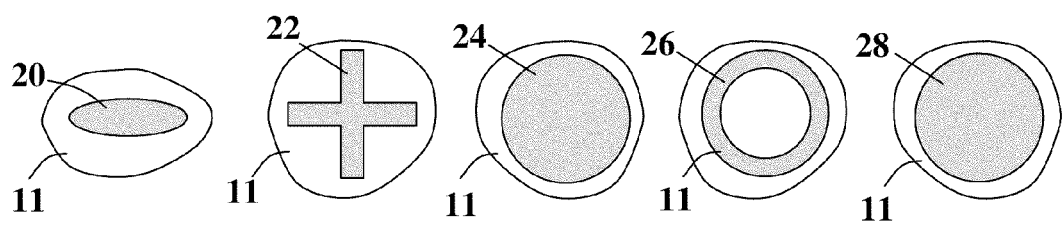
Figures 3B, 4B, 5B, 6B, 7B:
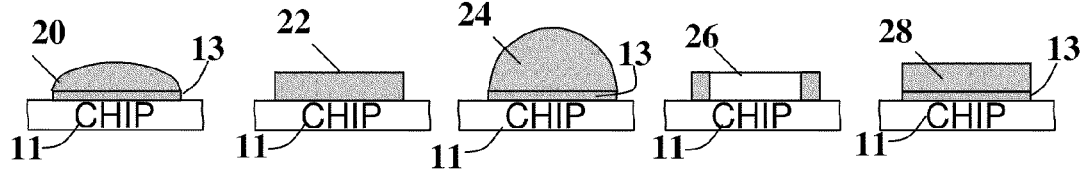
Figure 8:
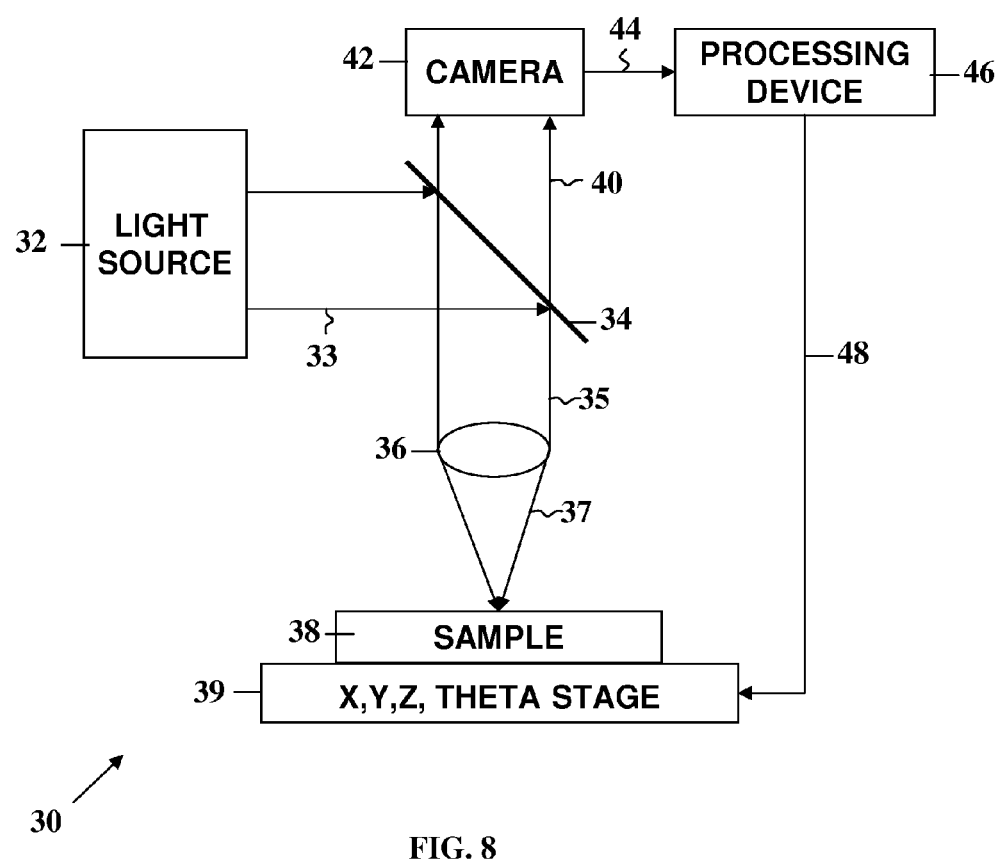
FIG. 8 is a schematic diagram of a system for scanning to produce images of features on a semiconductor chip in accordance with this invention.
Figure 11:
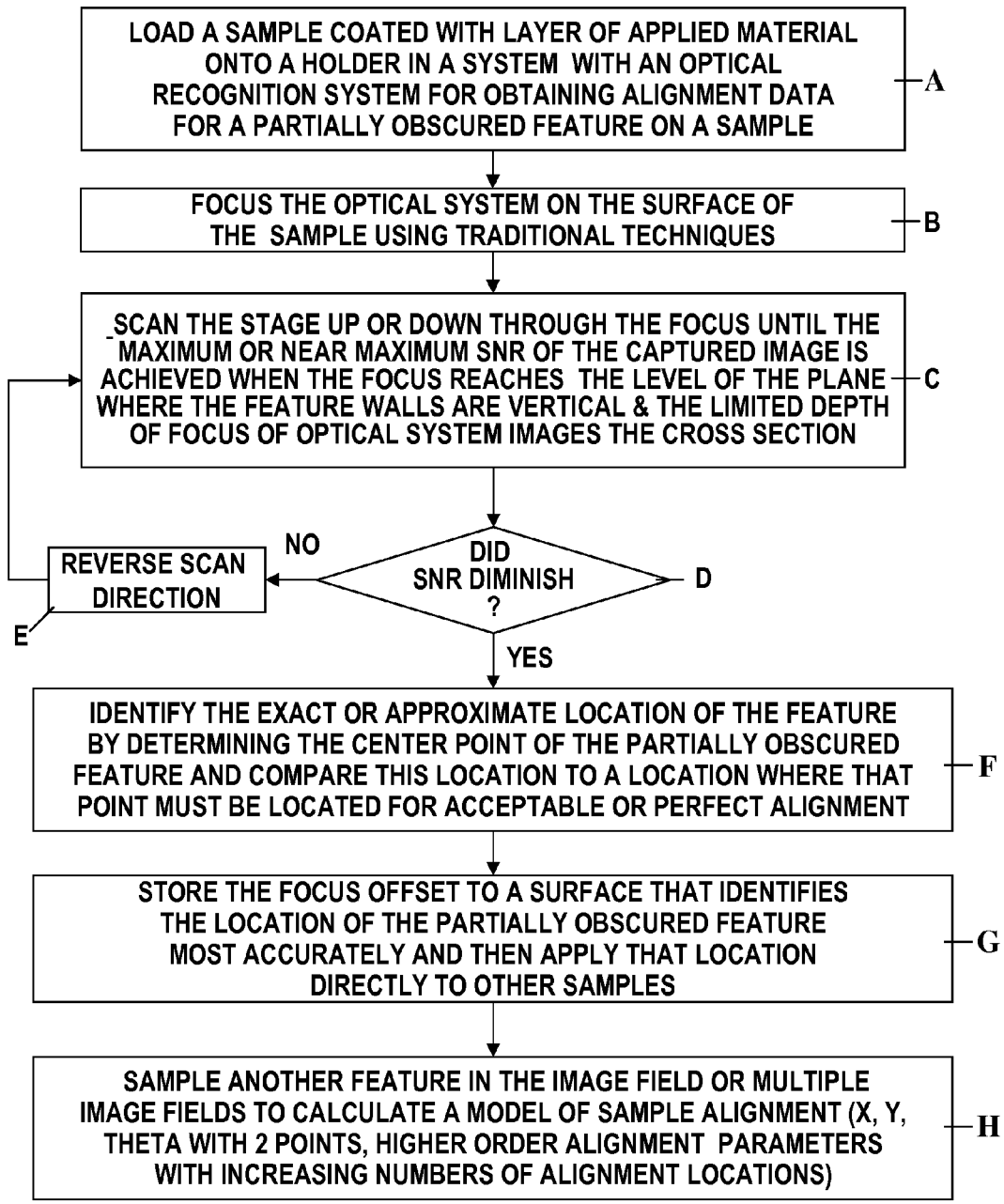
FIG. 11 is a flow chart of the program for controlling the system of FIG. 8 employing the alignment process of the current invention for Steps A-H that perform the focusing process of the present invention for features such as solder balls, bumps, etc. formed on a semiconductor chip. Step G is optional.

FIG. 11 is a flow chart of the program for controlling the system of FIG. 8 employing the alignment process of the current invention for a Steps A-H that perform the focusing process of the present invention for a feature formed on a semiconductor chip.

In FIG. 11 steps A-H perform the steps as follows:

In step A of FIG. 11, the system 46 loads the sample chip 38 of FIG. 8 which has been coated with a layer of applied material, onto a holder comprising the chip holder stage 39 in the system 30 of FIG. 8 with an optical recognition system 36/42/44/46/48 for obtaining alignment data for the partially obscured sample chip 38 on the chip holder stage 39.

In step B, the system 46 focuses the optical system 42/36/46 on the surface of the sample chip 38 using traditional techniques of moving the chip holder stage 34 in the Z direction.

In step C, the system 46 scans the stage 39 up or down through the focus obtained in Step B, until the maximum SNR is achieved on the image capture in the camera 40, and the processing device 46. The maximum SNR is achieved when the focus reaches the level of the plane where the sidewalls of the feature being examined are vertical and the limited depth of focus of the optical system images the cross section.

In step D, the system 46 performs a test as to whether contrast diminished in the previous iteration of Step C. If the answer is NO, the system 46 branches back to step C. If the answer is YES, the system 46 proceeds to Step E.

In step E, the system 46 reverses the direction of scan in the Z direction and returns to step C for another scan in the reverse direction from that in the previous iteration of Step C.

In step F, the system identifies the exact or approximate location of the feature by determining the center point of the feature and the system 46 compares this location to a location where that point has to be for perfect alignment.

In step G, the system 46 stores the focus offset to a surface that identifies the location of the partially obscured feature (structure) most accurately and then applies it directly to other samples to maximize throughput since the through-focusing step requires time.

In step H, the system 46 samples another feature in the image field or multiple image fields to calculate a model of sample alignment (x, y, theta with 2 points, higher order alignment parameters with increasing numbers of alignment locations).

Figure 12:
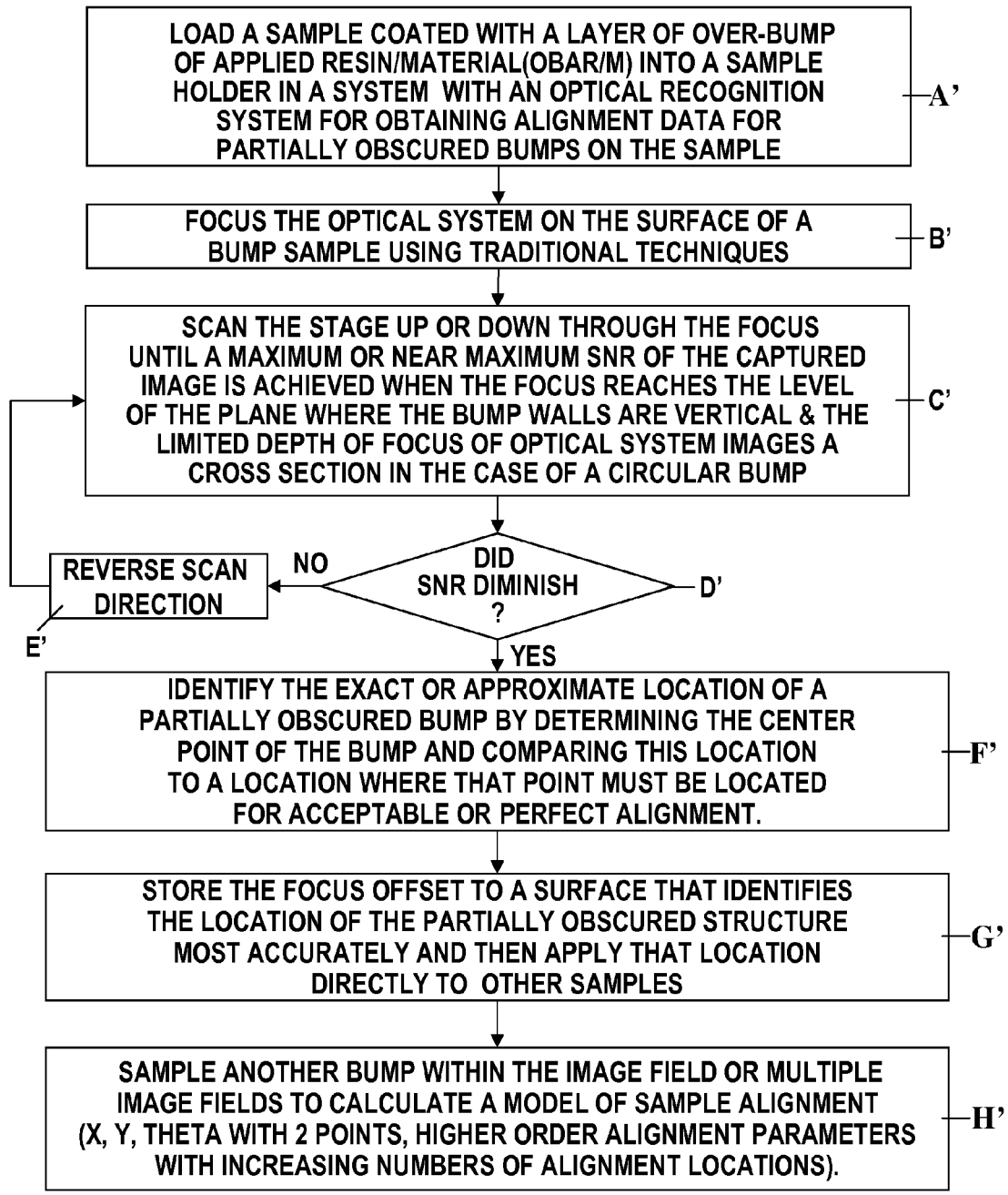
FIG. 12 is a flow chart of the program for controlling the system of FIG. 8 employing the alignment process of the current invention for a Steps A'-H' that perform the focusing process of the present invention for a feature comprising bumps formed on a semiconductor chip. Step G' is optional.

FIG. 12 is a flow chart of the program for controlling the system of FIG. 8 employing the alignment process of the current invention for Steps A-H that perform the focusing process of the present invention for a feature comprising bumps formed on a semiconductor chip.

In FIG. 12 steps A'-H' perform the steps as follows:

In step A' of FIG. 12, load a sample of Over Bump Applied Resin (OBAR) or other material coated onto a wafer or chip sample 38 of FIG. 8, onto a sample holder in the system with an optical recognition system 36/42/44/46/48 for aligning the wafer or chip sample 38 to a substrate on a substrate holder 39.

In step B', the (processing device) system 46 focuses the optical system 42/44/46 on the surfaces of the partially obscured bump on the sample 38 using traditional techniques of moving the stage 39 in the Z direction.

In step C', the (processing device) system 46 scans the stage 39 up or down through the focus obtained in Step B until the maximum or near minimum SNR of the image captured in the camera 40 and the processing device 44 is achieved.

In step D', the system 46 tests as to whether contrast was diminished in the previous iteration of Step C. If the answer is NO, the system 46 branches back to step E. If the answer is YES, the system 46 proceeds to Step E'.

In step E', the system 46 reverses the direction of scan in the Z direction and returns to step C for another scan in the reverse direction from that in the previous iteration of Step C.

In step F', the system 46 identifies the exact or approximate location of a partially obscured bump by determining the center point of the bump and the system 46 compares this location to a location where that point has to be for satisfactory, i.e. acceptable or perfect alignment.

In step G', the system 46 stores the focus offset to a surface that identifies the location of the partially obscured structure of the partially obscured bump most accurately and then applies it directly to other samples to maximize throughput since the through-focusing step requires some time.

In step H', the system 46 samples another feature in the image field or multiple image fields to calculate a model of sample alignment (x, y, theta with 2 points, higher order alignment parameters with increasing numbers of alignment locations).

One of the advantages of this method is that no specialized alignment marks are required since the interconnect features or similar existing features themselves can be used to identify their exact or approximate position. The above methods employ a mathematical determination of the location of the patterns without requiring prior learning of patterns in best focus to determine the exact or approximate location of said features, and subsequently using this information for the alignment of the sample to another matched or designated pattern.

Another advantage of this method is that it allows to automate the process of aligning parts to each other in order to increase the throughput in a manufacturing line.

The invention is for a process of aligning a part which exhibits a partially obscured bump, e.g. a C4 solder bump, a flat topped bump, etc.

The invention has been described in terms of preferred embodiments thereof, but is more broadly applicable as will be understood by those skilled in the art. The scope of the invention is only limited by the following claims.

What is claimed is:

1. A method of determining feature position data to be used for alignment of a sample to a substrate by employing a tool including a sample holder, a substrate holder and an optical recognition system by the steps as follows:
   employing identification of an exact or approximate location of a feature of said sample that is at least partially obscured by varying the depth of focus of said optical system upon a feature on said sample; and
   obtaining and determining a Signal to Noise Ratio (SNR) approximating a maximum value from an image captured by optical means scanning of a feature on said sample.

2. The method of claim 1 wherein said feature of said sample comprises an electrical interconnect structure such as a C4 solder ball or a copper stud bump.

3. The method of claim 2 including the steps as follows:
   employing pattern recognition of a feature in best focus to determine location information as to an exact or approximate location of said feature of said sample; and
   subsequently using said location information for the alignment of the sample to another matched or designated pattern.

4. The method of claim 1 wherein said feature of said sample is obscured by an over bump applied material.

5. The method of claim 4 including the steps as follows:
   employing pattern recognition of a feature in best focus to determine location information as to an exact or approximate location of said feature; and
   subsequently using said location information for the alignment of said sample to another matched or designated pattern.

6. The method of claim 1 including the step of
   employing a focus depth offset along the z axis from a surface;
   whereby good images of said feature are obtained.

7. The method of claim 6 including the steps as follows:
   employing pattern recognition of a feature in best focus to determine location information as to an exact or approximate location of said feature; and
   subsequently using said location information for the alignment of said sample to another matched or designated pattern.

8. The method of claim 1 including the steps of employing the results of a first alignment using a focus offset metric that can be used in subsequent alignment determination steps on either the same or subsequent samples in a same or a subsequent batch.

9. The method of claim 1 including the steps as follows:
   employing pattern recognition of a feature in best focus to determine location information as to an exact or approximate location of said feature of said sample; and
   subsequently using said location information for the alignment of another sample.

10. The method of claim 1 including the steps thereof used in combination with a mathematical determination of the location of the patterns without requiring prior learning of patterns in best focus to determine the approximate exact or approximate location of said features, and subsequently using this information for the alignment of the sample to another matched or designated pattern.

11. The method of claim 1 including the steps thereof applied for the purpose of wafer alignment for dicing.

12. The method of claim 1 including the steps thereof used for the alignment of matching parts in such applications as wafer alignment for wafer to wafer bonding, or chip alignment for chip to wafer bonding or chip to chip bonding or chip to substrate bonding.

13. The method of claim 1 including the steps thereof applied to pick and place tools.

14. A method of alignment including the steps as follows:
   determining feature position data of a feature of sample which position data is to be used for alignment by employing identification of an exact or approximate location of said feature of said sample that is at least partially obscured by a partially opaque material by varying focus upon said feature on said sample; and
   obtaining and determining a maximum Signal to Noise Ratio (SNR) from an image captured by optical means scanning of a feature on said sample;
   whereby high contrast imaging of edges of said feature is obtained.

15. The method of claim 14 including the steps as follows:
   employing pattern recognition of a feature in best focus to determine location information as to an exact or approximate location of said feature, and
   subsequently using said location information for alignment of said sample to another matched or designated pattern.

16. The method of claim 14 including the steps thereof used in combination with a mathematical determination of the location of the patterns without requiring prior learning of patterns in best focus to determine the exact or approximate location of said features, and subsequently using this information for the alignment of the sample to another matched or designated pattern.

17. The method of claim 14 including the steps thereof applied for the purpose of wafer alignment for dicing.

18. The method of claim 14 including the steps thereof used for the alignment of matching parts in such applications as wafer alignment for wafer to wafer bonding, or chip alignment for chip to wafer bonding or chip to chip bonding or chip to substrate bonding.

19. The method of claim 14 including the steps thereof applied to pick and place tools.

20. Apparatus including an optical system, a computer system, and software for providing alignment data to be used for alignment by employing identification of an exact or approximate location of a feature that is at least partially obscured by varying depth of focus of said optical system upon a feature on a sample thereby enabling obtaining and determining a Signal to Noise Ratio (SNR) approximating a maximum value from an image captured by optical means scanning of a feature on said sample.

\* \* \* \* \*